(12) United States Patent
Ishii et al.

(10) Patent No.: US 7,071,442 B2
(45) Date of Patent: Jul. 4, 2006

(54) PLASMA PROCESSING APPARATUS

(75) Inventors: Nobuo Ishii, Amagasaki (JP); Kibatsu Shinohara, Yokohama (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 11/009,086

(22) Filed: Dec. 13, 2004

(65) Prior Publication Data

US 2005/0173382 A1  Aug. 11, 2005

Related U.S. Application Data

(63) Continuation of application No. 09/975,067, filed on Oct. 12, 2001, now Pat. No. 6,847,003.

(30) Foreign Application Priority Data

Oct. 13, 2000  (JP) .............................. 2000-313811

(51) Int. Cl.
*B23K 10/00*  (2006.01)

(52) U.S. Cl. ............................. 219/121.43; 219/121.4; 118/723 I; 204/298.38

(58) Field of Classification Search ........... 219/121.43, 219/121.52, 121.54, 121.4, 121.47, 121.51, 219/121.55; 156/345.41, 345.21, 345.34; 118/723 I, 723 MW, 723 ME, 723 E, 715, 118/725, 728; 315/111.41, 111.21; 204/298.38, 204/192.35; 427/255.6, 384, 487, 576
See application file for complete search history.

(56) References Cited

U.S. PATENT DOCUMENTS

| 5,111,111 | A  | * | 5/1992  | Stevens et al. ......... 315/111.41 |
| 6,358,361 | B1 |   | 3/2002  | Matsumoto |
| 6,388,632 | B1 |   | 5/2002  | Murakawa et al. |
| 6,497,783 | B1 | * | 12/2002 | Suzuki et al. .......... 156/345.34 |
| 6,910,440 | B1 | * | 6/2005  | Ishii et al. .......... 118/723 MW |

FOREIGN PATENT DOCUMENTS

| JP | 05-345982 | A |   | 12/1993 |
| JP | 06216073  | A | * | 8/1994  |
| JP | 09017598  | A | * | 1/1997  |
| JP | 11-040397 | A |   | 2/1999  |
| JP | 11-121196 | A |   | 4/1999  |

\* cited by examiner

*Primary Examiner*—Quang Van
(74) *Attorney, Agent, or Firm*—Finnegan, Henderson, Farabow, Garrett & Dunner, L.L.P.

(57) ABSTRACT

A plasma processing apparatus includes a processing container 53, a mounting table 61 arranged in the processing container 53 to support a wafer W, a sealing plate 55 opposed to the wafer W supported by the mounting table 61, an annular antenna 73 arranged on the sealing plate 55 and consisting of an annular waveguide to introduce a microwave into the processing container 53 through the sealing plate 55, the annular antenna 73 being arranged so that a plane containing an annular waveguide path defined by the annular waveguide is generally parallel with the sealing plate 55, a directional coupler 79 arranged on the periphery of the annular antenna 73, a propagation waveguide 81 connected to the directional coupler 79 and a microwave oscillator 83 connected to the propagation waveguide 81. "Accordingly, it is possible to form an uniform microwave in the antenna, so that an uniform plasma can be produced in the processing container".

5 Claims, 11 Drawing Sheets

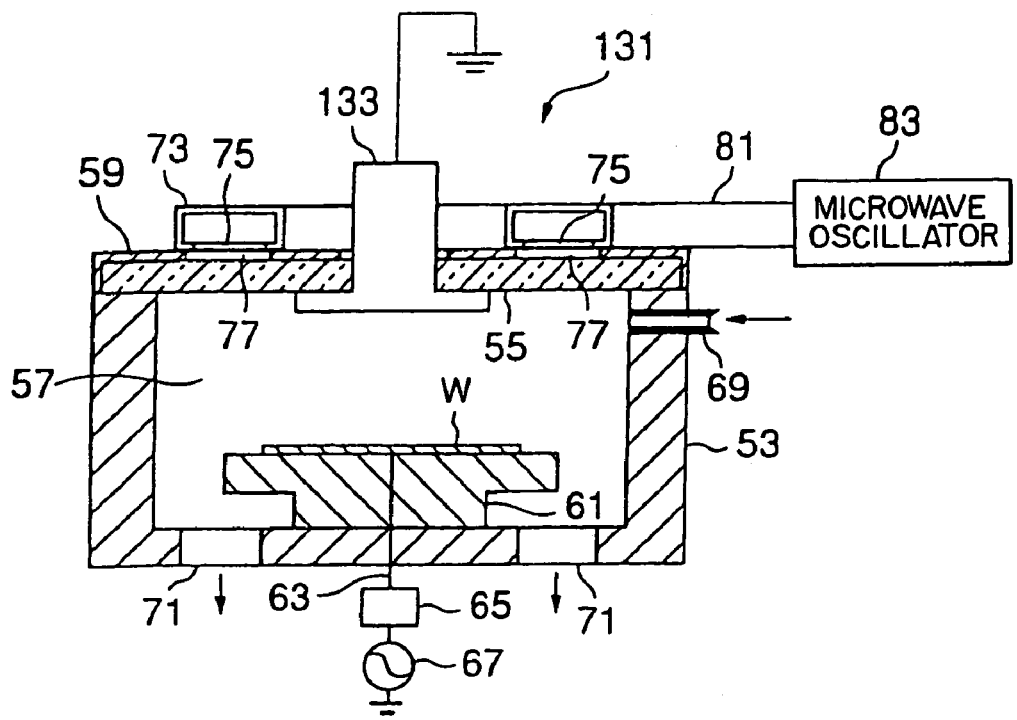
F I G. 4
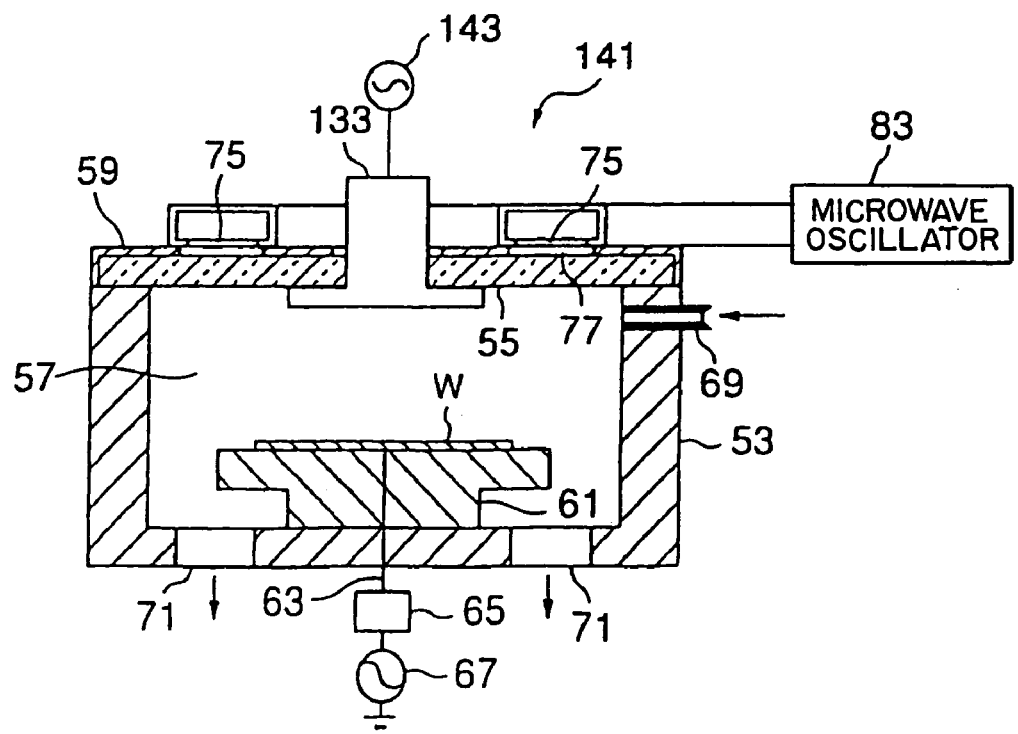
F I G. 5

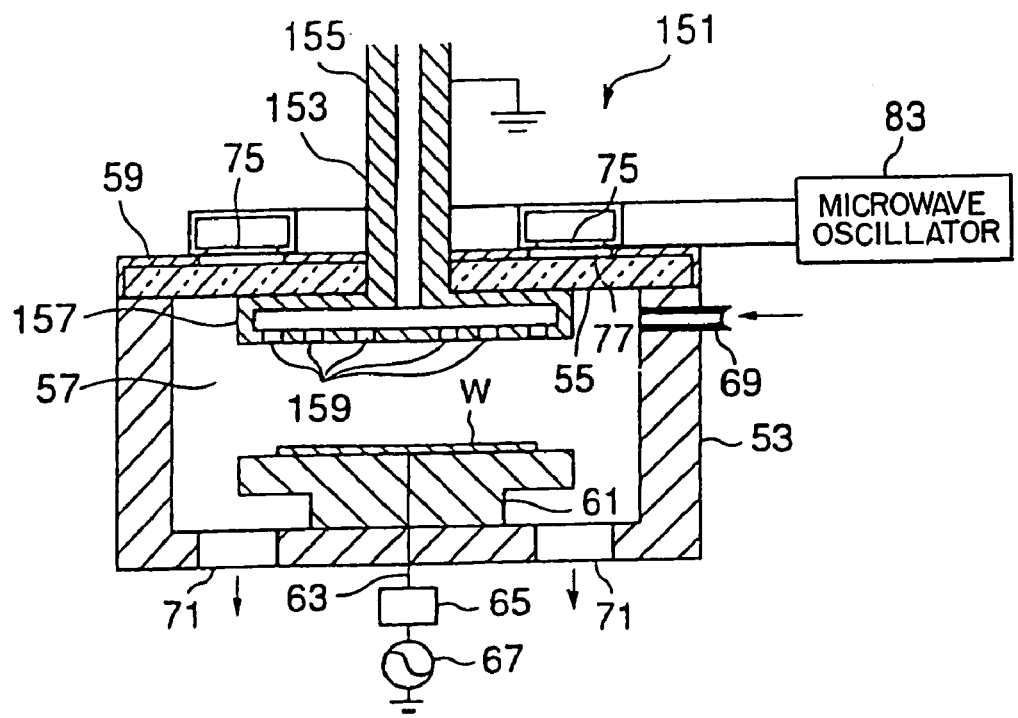
F I G. 6
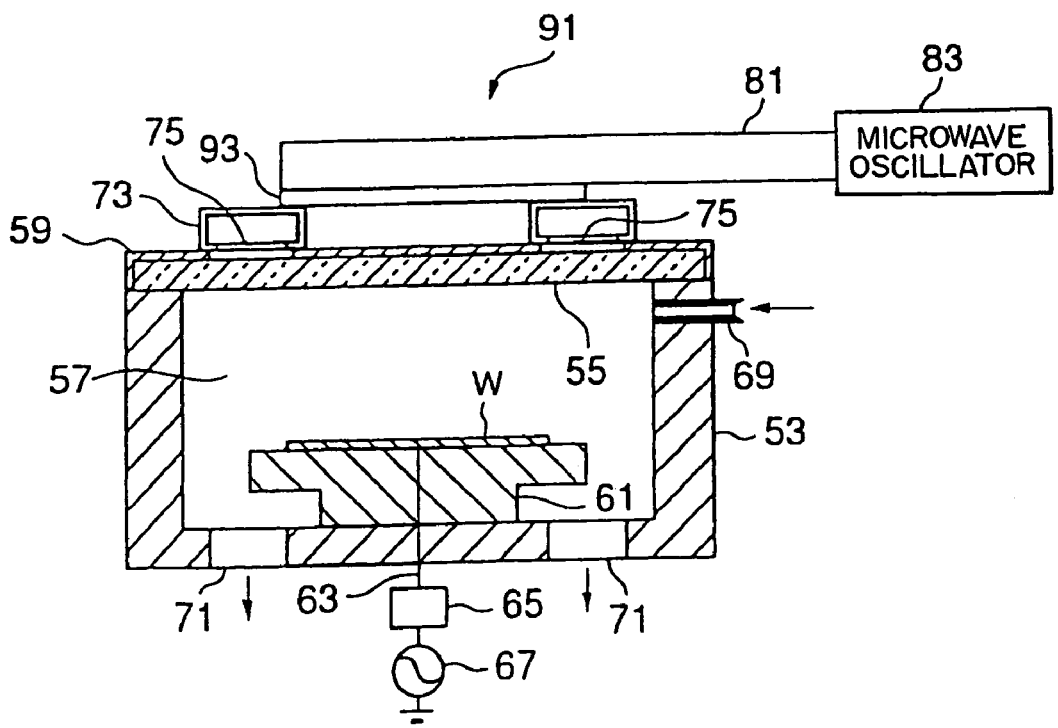
F I G. 7

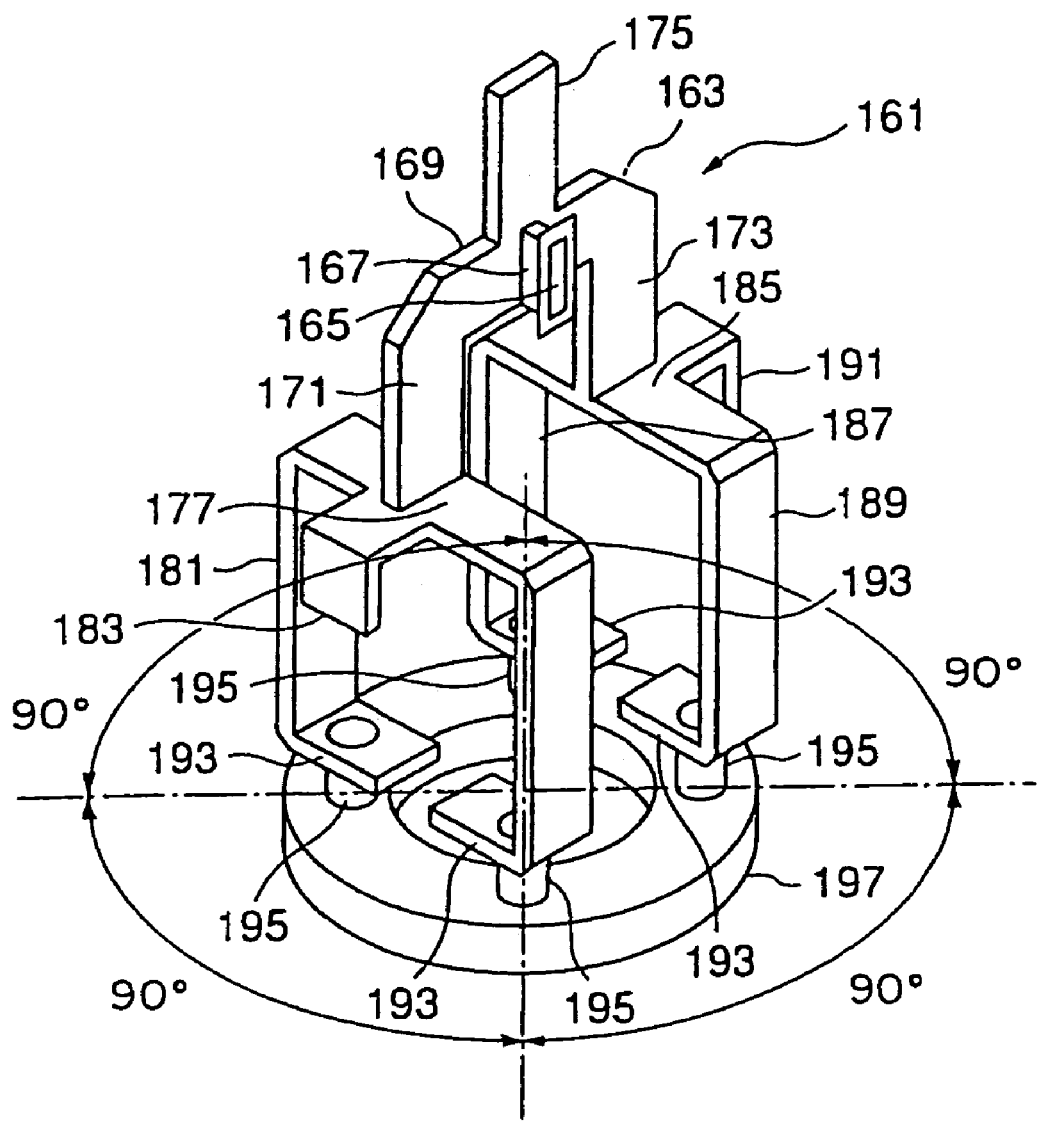
F I G. 10

PLASMA PROCESSING APPARATUS

CROSS REFERENCE TO RELATED APPLICATIONS

This is a continuation of pending U.S. patent application Ser. No. 09/975,067, filed Oct. 12, 2001, now U.S. Pat. No. 6,847,003, the entirety of which is incorporated herein by reference. U.S. patent application Ser. No. 09/975,067 and this application also claim the benefit of priority under 35 U.S.C. § 119(a)–(d) of Japanese Patent Application No. 2000-313811, filed in the Japanese Patent Office on Oct. 13, 2000.

BACKGROUND OF THE INVENTION

1. Technical Field of the Invention

The present invention relates to a plasma processing apparatus utilizing a high-frequency wave.

2. Description of the Related Art

Conventionally, there is known a plasma processing apparatus which includes an antenna consisting of an annular waveguide arranged on the upper face of a processing container to supply its interior with a microwave, as shown in FIG. 17 (Japanese Patent Publication kokai No. 11-121196).

This plasma processing apparatus 11 has a processing container 13 on which an antenna 15 is mounted. The antenna 15 is formed by an annularly-curled waveguide having its end closed and has slots 17 . . . formed on the side of the processing container 13. The other end of the antenna 15 is connected to a microwave oscillator 19.

In the plasma processing apparatus 11, the microwave from the microwave oscillator 19 is reflected on an end 21 of the antenna 15 to form a standing wave in the waveguide. Then, the microwave is emitted into the processing container 13 through the slots 17 . . . thereby to generate a plasma for processing.

While, FIG. 18 shows another plasma processing apparatus 31 (Japanese Patent Publication kokai No. 5-34598) in which an antenna 35 in the form of an annular waveguide is wound around the outer periphery of a processing container 33 and also connected to a microwave oscillator 39 through a waveguide 37. In operation, the microwave supplied from the microwave oscillator 39 is divided into left and right at a connecting part 41 between the waveguide 37 and the antenna 35. Then, the so-divided microwaves meet again at a part 43 on the opposite side of the connecting part 41 and is reflected mutually to form a standing wave in the antenna 35. Through slots 45 . . . formed on the inner side of the antenna 35, the microwaves are emitted into the inside processing container 33, so that the plasma is produced in the processing container 33 for processing.

Further, FIG. 19 shows a plasma processing apparatus 121 (Japanese Patent Publication kokai No. 11-40397) which includes an antenna 125 consisting of an annular waveguide arranged on the upper face of a processing container 123. The antenna 125 has a plurality of slots 127 . . . formed on the side of the processing container 13. The upper face of the annular antenna 125 is connected to a waveguide 129 for supplying a microwave, perpendicularly. A convex ridge 131 is formed at a joint part between the waveguide 129 and the antenna 125. The microwave propagated from the waveguide 129 is divided to two groups of microwaves at the convex ridge 131. Then, the so-divided microwaves meet again on the opposite side of the joint part and is reflected mutually to form a standing wave in the antenna 125. The plasma processing apparatus 121 is adapted so as to emit a microwave from the standing wave toward the processing container 13.

In the above plasma processing apparatuses 11, 31, 121 each forming the standing wave in the antenna, however, the microwave has different intensities at each node and antinode of the standing wave. Thus, due to the positional relationship between node and antinode in the antenna, a problem arises in that the interior of the processing container has an electromagnetic field of uneven intensity. Additionally, if the position of each node of the standing wave is deviated from the slot of the antenna, the uniformity of electromagnetic field cannot be maintained in the processing container, causing a problem of impossibility to produce the plasma uniformly, hitherto.

SUMMARY OF THE INVENTION

In order to solve the above-mentioned problem, the object of the present invention is to provide a plasma processing apparatus which is capable of forming an uniform microwave in an antenna thereby to produce an uniform plasma in a processing container.

The first feature of the present invention resides in a plasma processing apparatus which comprises:
- a processing container in form of a cylinder with a bottom;
- a supporting unit disposed in the processing container to support an object to be processed;
- a dielectric window arranged in an opening of the processing container to close up the processing container in an air-tight manner, the dielectric window being made of dielectric allowing a high-frequency wave to permeate the dielectric window into an interior of the processing container;
- an annular waveguide shaped in form of a ring to introduce the high-frequency wave into the processing container through the dielectric window and also fitted to the dielectric window so that a plane containing an annular waveguide path of the annular waveguide extends along the dielectric window; and
- a traveling-wave generator arranged at the annular waveguide to produce a traveling wave in form of an endless ring in the annular waveguide.

The second feature of the present invention resides in that the traveling-wave generator includes:
- a high-frequency wave generator for supplying the high-frequency wave;
- a propagation waveguide tube connected to the high-frequency wave generator to propagate the high-frequency wave generated in the high-frequency wave generator; and
- a directional coupler arranged between the propagation waveguide and the annular waveguide to connect the propagation waveguide with the annular waveguide thereby to supply the annular waveguide with the high-frequency wave which has been propagated in the propagation waveguide, as the traveling wave.

The third feature of the present invention resides in that the annular waveguide has its circumferential length a natural number of times as long as a wave length in the annular waveguide.

The fourth feature of the present invention resides in that the traveling-wave generator has a multiphase high-frequency wave supplier for supplying several positions apart from each other in the circumferential direction of the annular waveguide with high-frequency waves whose phases are shifted from each other in the circumferential direction, whereby the supply of the high-frequency waves whose phases are shifted from each other in the circumferential direction of the annular waveguide allows the traveling wave to be generated in the annular waveguide.

The fifth feature of the present invention resides in that the multiphase high-frequency wave supplier comprises:
  a high-frequency wave generator for generating a high-frequency wave in TE11 mode;
  a cylindrical waveguide having its one end connected to the high-frequency wave generator;
  a circularly-polarized wave converter arranged in the middle of the cylindrical waveguide to rotate the high-frequency wave in TE11 mode being propagated in the cylindrical waveguide about an axis of the cylindrical waveguide; and
  a plurality of branch waveguides having respective one ends connected to an outer face of another end of the cylindrical waveguide at respective positions apart from each other in the circumferential direction of the cylindrical waveguide and also having the other ends connected to the annular waveguide at respective positions apart from each other in the circumferential direction of the annular waveguide.

The sixth feature of the present invention resides in that the multiphase high-frequency wave supplier comprises:
  a high-frequency wave generator for generating a high-frequency wave in TE11 mode in the waveguide;
  a plurality of branch waveguides having respective one ends connected to the waveguide and the other ends connected to the annular waveguide at respective positions apart from each other in the circumferential direction of the annular waveguide; and
  phase shifters arranged in the branch waveguides respectively to control respective phases of plural high-frequency waves divided by the branch waveguides so that a traveling wave is generated in the annular waveguide when the high-frequency waves are supplied into the annular waveguide.

The seventh feature of the present invention resides in that circumferential length of the annular waveguide is a natural number of times as long as a wave length in the annular waveguide.

The eighth feature of the present invention resides in that the waveguide to supply the annular waveguide with the high-frequency wave is shaped to be rectangular.

The ninth feature of the present invention resides in that the waveguide to supply the annular waveguide with the high-frequency wave is a coaxial waveguide.

The tenth feature of the present invention resides in that the plasma processing apparatus further comprises a gas supply tube for supplying the processing container with gas, wherein the gas supply tube has its opening connected to a part of the dielectric window surrounded by the annular waveguide.

The eleventh feature of the present invention resides in that the dielectric window is provided, at its part surrounded by the annular waveguide, with an opposing electrode arranged in opposition to the supporting unit.

The twelfth feature of the present invention resides in that the dielectric window is provided, at its part surrounded by the annular waveguide, with a leading end of a gas supply tube for supplying the processing container with gas, the leading end having an opening formed to supply the gas into the processing container and also providing an opposing electrode arranged in opposition to the supporting unit.

The thirteenth feature of the present invention resides in that the opposing electrode is grounded for earth.

The fourteenth feature of the present invention resides in that the opposing electrode is connected to a high-frequency power source.

The fifteenth feature of the present invention resides in that the annular waveguide is in form of a circular loop.

The sixteenth feature of the present invention resides in that the annular waveguide is in form of a rectangular loop.

The seventeenth feature of the present invention resides in that the high-frequency wave has a frequency from 200 MHz to 35 GHz.

BRIEF DESCRIPTION OF THE DRAWINGS

FIG. 1A shows its typical example; FIG. 1B shows the apparatus in case of strengthening a plasma at the center of a chamber; and FIG. 1C shows the apparatus in case of strengthening a plasma in the periphery of the chamber;

FIG. 4 is a side sectional view of a processing apparatus, showing the third embodiment of the present invention where an opposing electrode is arranged at the center of the annular waveguide and is also grounded, in the processing apparatus of FIG. 1A;

FIG. 5 is a side sectional view of a processing apparatus, showing the fourth embodiment of the present invention where the opposing electrode is arranged at the center of the annular waveguide and is connected to a high-frequency source, in the processing apparatus of FIG. 1A;

FIG. 6 is a side sectional view of a processing apparatus, showing the fifth embodiment of the present invention where a gas supply tube functioning as an opposing electrode is arranged at the center of the annular waveguide and is grounded, in the processing apparatus of FIG. 1A;

FIG. 7 is a side sectional view of a processing apparatus, showing the sixth embodiment of the present invention where a propagation waveguide is connected to an upper face of the annular waveguide through a directional coupler, in the processing apparatus of FIG. 1A;

FIG. 10 is a perspective view of a processing apparatus in accordance with the eighth embodiment of the present invention;

DESCRIPTION OF THE PREFERRED EMBODIMENT

With reference to FIGS. 1A to 16, embodiments of the present invention will be described below.

Figure 1A:
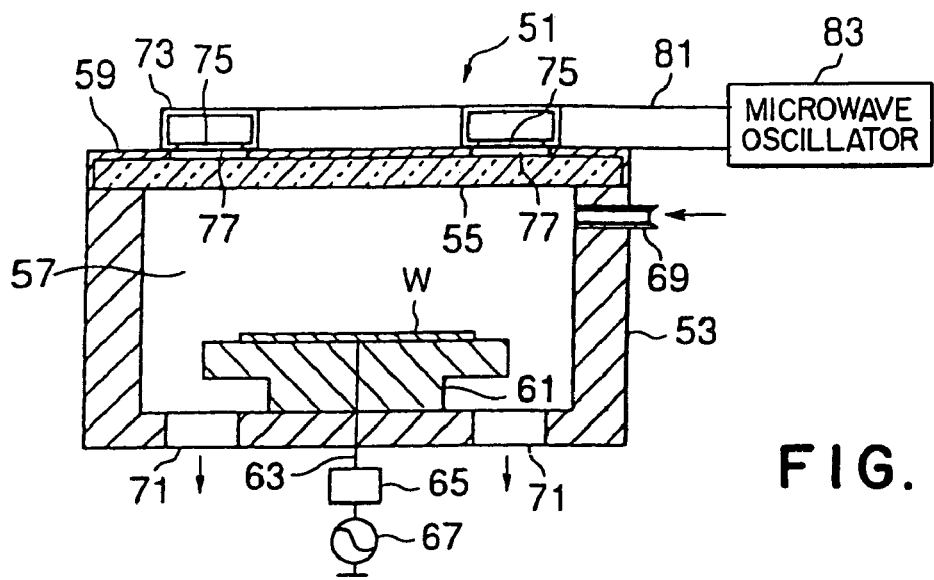
FIGS. 1A, 1B and 1C are side sectional views showing a plasma processing apparatus in accordance with the first embodiment of the present invention.

FIGS. 1A, 1B, 1C and 2 are structural views showing the plasma processing apparatus of the first embodiment. In FIG. 1A, this plasma etching apparatus 51 has a processing container 53 whose sidewall and bottom are made of conductive material, such as aluminum, and which is shaped to be a cylinder with bottom, as a whole. The ceiling part of the container 53 is opened, whereas it is sealed by a sealing plate 55 having a thickness to endure a vacuum pressure through a sealant, such as O-ring, in an air-tight manner. This sealing plate 55 is made from dielectric material exhibiting heat-resistance, microwave permeability and small dielectric loss, for example, silica glass, alumina, ceramics of aluminum nitride or the like. Owing to the provision of the sealing plate 55, there is defined a processing space 57 in the processing container 53. Fitted on the sealing plate 55 is a cover member 59 in the form of a circular lid of conductive material, which is fixed on the processing container 53.

In the processing container 53, a mounting table 61 is accommodated to mount a semiconductor wafer W as the object to be processed, thereon. The mounting table 61 is made of aluminum and also disposed on the bottom of the processing container 53 through an insulating member. The mounting table 61 is connected with a matching box 65 and a bias high-frequency source 67 through a power line 63. The processing container 53 is provided, on a sidewall thereof, with a gas nozzle 69 of a silica pipe to introduce a processing gas into the container 53. On the bottom of the processing container 53, there are provided exhaust ports 71, 71 communicated with a not-shown vacuum pump, allowing the interior of the processing container 53 to be evacuated to a predetermined pressure as occasion demands.

While, arranged on the upper face of the cover member 59 is an annular antenna 73 which introduces a microwave into the processing space 57. The annular antenna 73 can be obtained by forming a waveguide having a rectangular section so as to be endless and annular. The antenna 73 is also arranged so that a plane containing an annular waveguide path defined by the annular waveguide is substantially parallel with the sealing plate 55. In the pipe wall of the annular antenna 73 on the side of the processing space 57, a plurality of slots 75 are formed to extend in a radial direction of the antenna, at intervals in the circumferential direction. Correspondingly, the cover member 59 has a plurality of openings 77 formed to correspond to the slots 75, respectively.

On the outside face of the annular antenna 73, a propagation waveguide 81 is connected tangential to the antenna 73 through a directional coupler 79. The other end of the propagation waveguide 81 is connected to a microwave oscillator 83 for supplying the microwave. The directional coupler 79 operates to make the microwave, which has been propagated in the waveguide 81 from the microwave oscillator 83 in the direction of arrow A in the figure, propagate only in the direction of arrow B in the annular antenna 73. Consequently, the microwave as a traveling wave is propagated in the annular antenna 73 in the form of an endless ring, only in the only one direction (the direction of arrow B). A microwave absorber 85 is detachably attached to the inside of an end of the propagation waveguide 81 on the side of the directional coupler 79. The microwave absorber 85 operates to prevent the microwave propagated in the propagation waveguide 81 in the direction of arrow A from being reflected on the end of the propagation waveguide 81 into a standing wave, thereby to maintain a traveling wave. Note, it is also possible to change a traveling-wave mode to a standing-wave mode by replacing the microwave absorber by a microwave reflector. In such a constitution, the above annular antenna 73, the directional coupler 79 and the propagation waveguide 81 constitute a ring resonator 74. In the ring resonator 74, it is preferable to employ a so-called "short-slot" hybrid having a degree of coupling 3 dB for the directional coupler 79. In case of arranging a plurality of directional couplers in the circumferential direction of the above annular waveguide, a path length of waveguide between the adjoining directional couplers has only to be adjusted together with the adjustment in phases of the so-supplied microwaves so that a traveling wave can be formed in a single direction of the annular waveguide.

Next, the operation of the above-constructed apparatus of the embodiment will be described. First, through a not-shown gate valve, the semiconductor wafer W is accommodated in the processing container 53 by a transfer arm and successively mounted on the upper face of the mounting table 61. Then, while maintaining the interior of the processing container 53 at a predetermined processing pressure, a processing gas under its flow control is supplied into the container through the gas nozzle 69. Simultaneously, the microwave of e.g. 2.45 GHz as a high-frequency wave is introduced from the microwave oscillator 83 thereby producing a plasma for processing. In connection, if a bias high-frequency power is applied on the mounting table 61, then a negative potential can be produced on the mounting table 61, allowing an ion to be extracted from the plasma effectively.

In the above structure, the microwave supplied from the microwave oscillator 83 is propagated in the propagation waveguide 81 in the direction of arrow A and subsequently supplied into the annular antenna 73 at directional coupler 79. Hereat, it is desirable that the microwave supplied from the microwave oscillator 83 to the annular antenna 73 has a frequency from 200 MHz to 35 GHz. In case of adopting the microwave of 200 MHz whose wave length is 1.47 m, the annular waveguide path of one wave length will have 46.8 cm in diameter, which is believed to be a maximum size in view of the dimension of a chamber defined therein. Alternatively, in case of the microwave of 35 GHz having 8.4 mm in wave length, the annular waveguide path of one wave length will have a minimum length under the present arrangement of slots by 0.8 mm in plate thickness, 2 mm in opening width and 2 mm in interval. Here, since the directional coupler 79 is arranged at the connecting part between the propagation waveguide 81 and the annular antenna 73, the microwave propagated in the direction of arrow A in the propagation waveguide 81 is then propagated only in the direction of arrow B in the annular antenna 73, producing a traveling wave rotating in the annular antenna 73 in the form of an endless ring. Then, the microwave being propagated as the traveling wave in the annular antenna 73 is emitted to the interior of the processing container 53 through the numerous slots 75. Note, since the microwave traveling in the annular antenna 73 is not a standing wave but a traveling wave rotating in the annular antenna in the form of an endless ring, an electromagnetic field emitted from the slots 75 becomes uniform in the circumferential direction of the annular antenna 73. Accordingly, it is possible to produce a remarkably uniform plasma in the processing container 53, allowing an uniform processing to be applied on even a large-diameter wafer throughout.

According to the embodiment, since the plasma processing apparatus comprises the processing container 53, the mounting table 61 disposed in the processing container 53 to support the wafer W, the sealing plate 55 opposing the wafer W supported by the mounting table 61, the annular antenna 73 consisting of an annular waveguide to introduce the microwave into the processing container 53 through the sealing plate 55 and also having its plane containing an annular waveguide path arranged to be substantially parallel with the sealing plate 55, the directional coupler 79 arranged in the periphery of the annular antenna 73, the propagation waveguide 81 connected with the directional coupler 79 and the microwave oscillator 83 connected to the propagation waveguide 81, it is possible to form a traveling wave in the from of an endless ring in the annular antenna 73 thereby to emit an electromagnetic field which is uniform in the circumferential direction, into the annular antenna 73. Thus, it is possible to produce an uniform plasma in the processing container 53, allowing an uniform processing to be applied on even a large-diameter wafer.

Figure 1B:
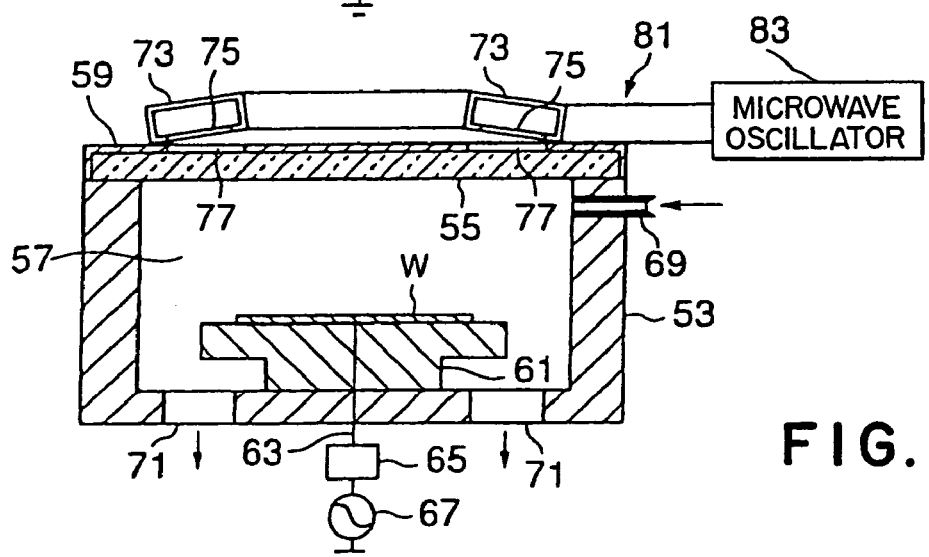
Figure 1C:
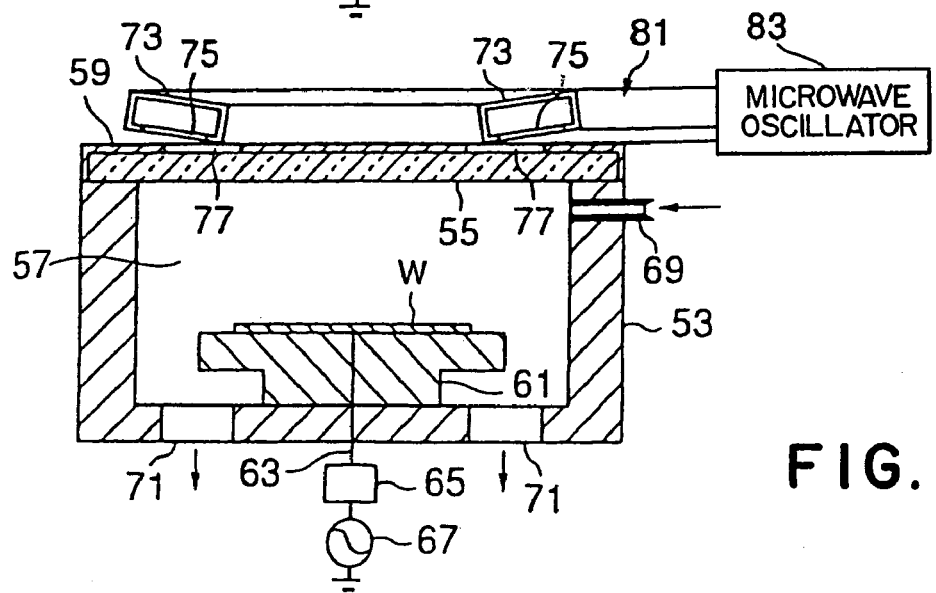
Figure 2:
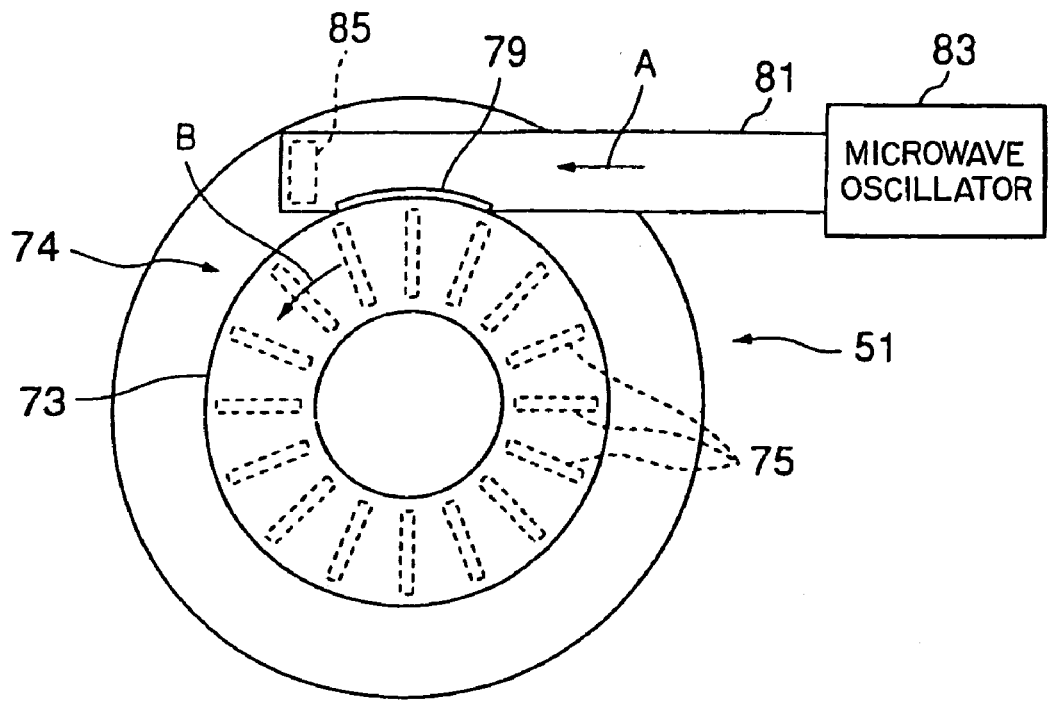
FIG. 2 is a plan view of the processing apparatus of FIG. 1A.

When it is required to alter the producing condition of plasma, there may be inclined an angle between a plane having the slots 75 of the annular antenna 73 formed therein and the sealing plate 55. For example, when it is required to intensify the production of plasma at the center of the chamber, the plane having the slots 75 formed therein is inclined so as to direct the center of the chamber, as shown in FIG. 1B. Conversely, when it is required to intensify the production of plasma at the periphery of the chamber, the plane having the slots 75 formed therein has only to be inclined so as to direct the periphery of the chamber.

Figure 3:
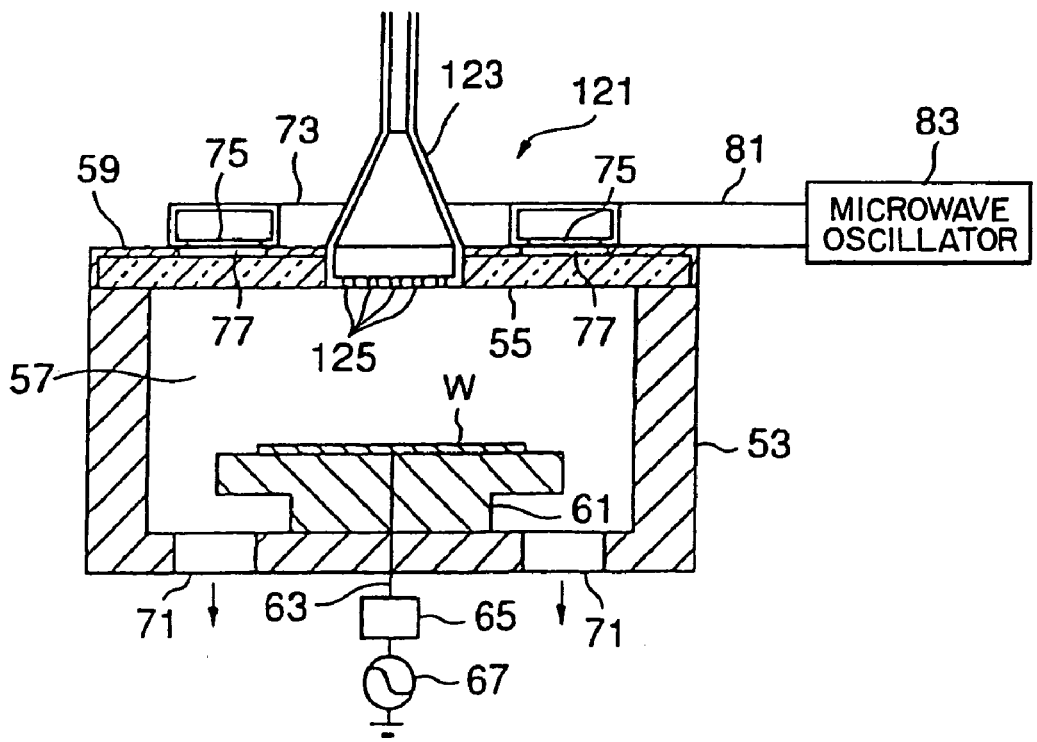
FIG. 3 is a side sectional view of a processing apparatus, showing the second embodiment of the present invention where a gas supply tube is arranged at the center of an annular waveguide in the processing apparatus of FIG. 1A.

FIG. 3 is a view showing a plasma processing apparatus 121 in accordance with the second embodiment of the present invention. This plasma processing apparatus 121 is similar to the plasma processing apparatus 51 besides a gas supply tube 123 arranged at the center of the sealing plate 55 surrounded by the annular antenna 73. This gas supply tube has a lower part funnel-shaped so as to gradually increase its diameter as approaching the lowermost end provided with a number of nozzles 125. In this way, since the antenna 73 supplying the processing container 53 with the microwave is in the form of a circular loop, the gas supply tube 123 can be provided at the central opening of the antenna 73. Accordingly, it is possible to supply the wafer W with reactive gas etc. uniformly, thereby preventing the uneven processing due to unequal gas supply.

FIG. 4 is a view showing a plasma processing apparatus 131 in accordance with the third embodiment of the present invention. This plasma processing apparatus 131 is similar to the plasma processing apparatus 51 besides an opposing electrode 133 arranged at the center of the sealing plate 55 surrounded by the annular antenna 73 so as to oppose the mounting table 61. The opposing electrode 133 is grounded for earthing. With this arrangement, it is possible to form a strong and uniform electromagnetic field between the mounting table 61 and the opposing electrode 133, whereby ions can be extracted from the plasma effectively, accomplishing an uniform processing.

FIG. 5 is a view showing a plasma processing apparatus 141 in accordance with the fourth embodiment of the present invention. This plasma processing apparatus 141 is similar to the plasma processing apparatus 131 of the third embodiment in FIG. 4 besides a high-frequency source 143 in place of the earth for the opposing electrode 133. In this way, since the opposing electrode 133 is connected to the high-frequency source 143, it is possible to form a desired strong and uniform electromagnetic field between the mounting table 61 and the opposing electrode 133. Therefore, it is possible to accomplish the extraction of ions from the plasma more effectively and also the uniform processing.

FIG. 6 is a view showing the fifth embodiment of the present invention. A plasma processing apparatus 151 of this figure is similar to the same of the third embodiment except that the lower end of a gas supply tube is formed by an opposing electrode. The gas supply tube 153 has a cylindrical gas tube body 155 and a nozzle part 157 in the form of a hollow disc connected to the lower end of the tube body 155. A plurality of nozzle orifices 159 . . . are formed on the underface of the nozzle part 157 opposed to the mounting table 61. The gas supply tube 153 is made from conductor and also grounded through an earthing line. In the gas supply tube 153 constructed above, the processing gas passing through the gas tube body 155 is diffused in the radial direction at the nozzle part 157 and subsequently supplied into the processing container 53 through the nozzle orifices 159 uniformly. Further, since this gas supply tube is grounded for earthing, it also serves as an opposing electrode opposing the mounting table 61. Alternatively, the gas supply tube may be separated from halfway through insulation so that the nozzle part is connected to the high-frequency source.

In this way, as the gas supply tube 153 of the plasma processing apparatus 151 has functions of supplying the processing gas and also providing an opposing electrode in opposition to the mounting table, it is possible to supply the wafer W with reactive gas etc. uniformly and also possible to form an uniform and strong electric field between the mounting table 61 and the opposing electrode 153, whereby an uniform plasma can be produced.

Figure 8:
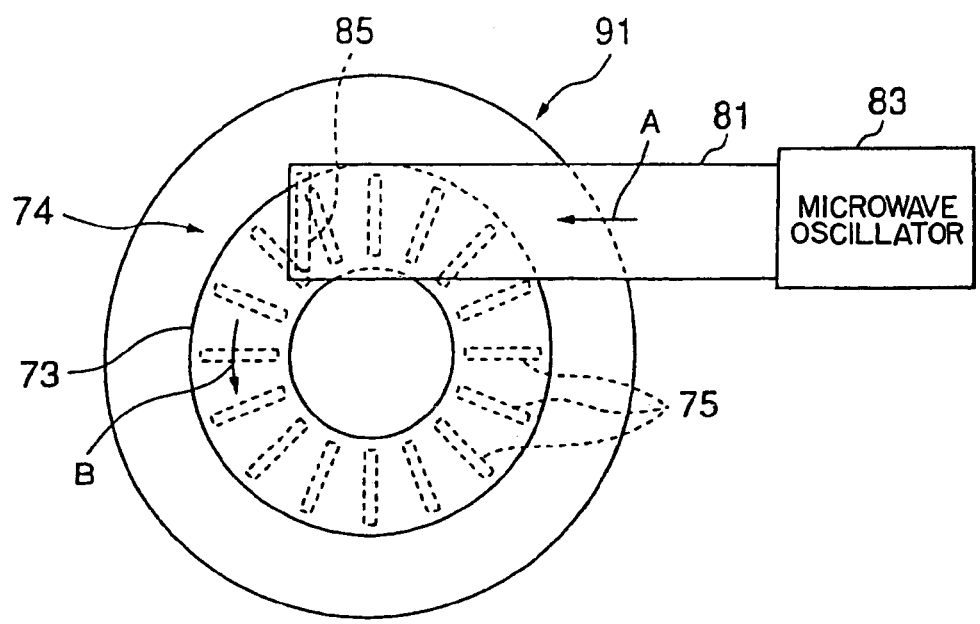
FIG. 8 is a side sectional view of the processing apparatus of FIG. 7.

FIGS. 7 and 8 show the sixth embodiment of the present invention. A plasma processing apparatus 91 in these figures is similar to the plasma processing apparatus 51 of FIGS. 1 and 2 except that the propagation waveguide 81 is connected with the upper face of the annular antenna 73 in the form of a circular loop, through a directional coupler 93.

The plasma processing apparatus 91 exhibits operation and effect similar to those of the plasma processing apparatus 51.

Figure 9:
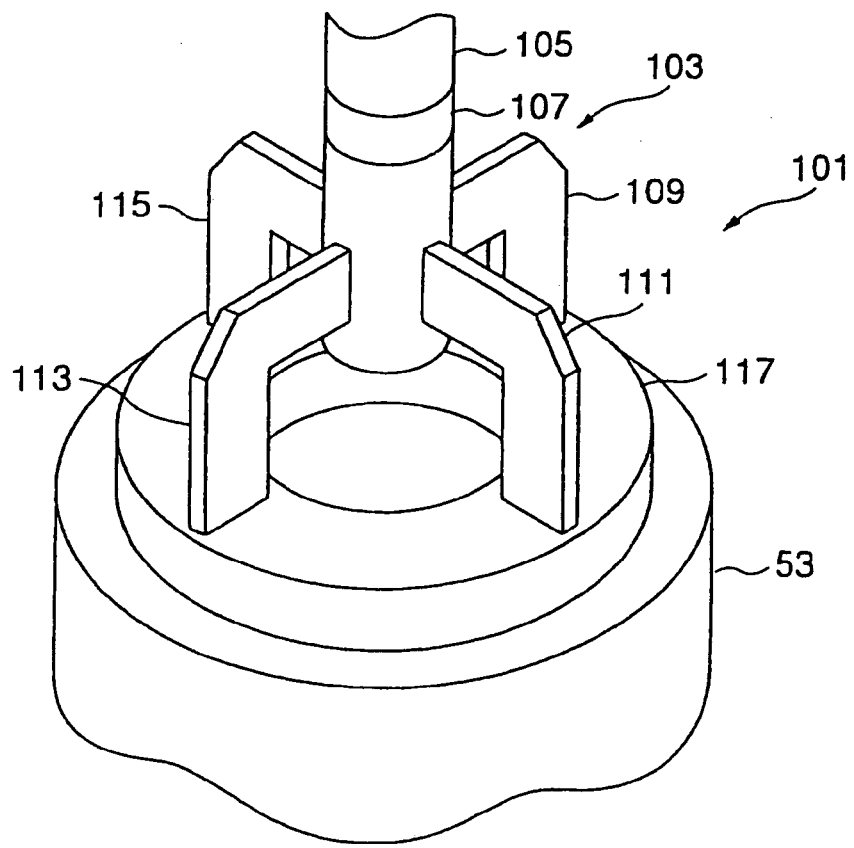
FIG. 9 is a perspective view of a processing apparatus in accordance with the seventh embodiment of the present invention.

FIG. 9 shows the seventh embodiment of the present invention. In a plasma processing apparatus 101, a power supply unit 103 is arranged on the annular antenna 117 on the processing container 53. The power supply unit 103 has a cylindrical waveguide 105. A not-shown microwave oscillator is connected to the cylindrical waveguide 105 to supply the microwave in TE11 mode. In the middle of the cylindrical waveguide 105, a circularly-polarized wave converter 107 is arranged to rotate the so-supplied "TE11 mode" microwave about an axis of the cylindrical waveguide 105. Connected to the outer face of the lower end of the cylindrical waveguide 105 are first to fourth branch waveguides 109, 111, 113, 115 which project radially outward at intervals of 90 degrees around the axis of the waveguide 105. After projecting radially outward, the first to the fourth branch waveguides 109, 111, 113, 115 are respectively bent so as to extend downwardly. These first to fourth branch waveguides are finally connected to an annular antenna 117 in the form of a circular loop, at respective positions apart from each other by 90 degrees in the circumferential direction of the antenna 117.

With the structure mentioned above, the "TE11 mode" microwave being propagated from the microwave oscillator (not shown) into the cylindrical waveguide 105 reaches the circularly-polarized wave converter 107. By the circularly-polarized wave converter 107, the "TE11 mode" microwave is rotated about the axis of the cylindrical waveguide 105 to reach the lowermost end of the cylindrical waveguide 105. Hereat, the rotating "TE11 mode" microwave enters the first to the fourth branch waveguides 109, 111, 113, 115. Note, the microwave propagated in the cylindrical waveguide 105 is a rotating circularly-polarized wave and additionally, the first to the fourth branch waveguides 109, 111, 113, 115 are connected to the outer face of the cylindrical waveguide 105 while being shifted from each other by 90 degrees in the circumferential direction of the waveguide. Therefore, the phases of respective microwaves entering the annular antenna 117 through the first to the fourth branch waveguides 109, 111, 113, 115 are also shifted from each other by 90 degrees. Thus, the microwaves entering the annular antenna 117 forms a traveling wave rotating in the circumferential direction, as a whole. The "rotating" traveling wave formed in the annular antenna 117 is uniformly emitted into the processing container 53 through slots (not shown) formed on the underface of the antenna, thereby forming an uniform plasma.

In this way, according to this embodiment, the plasma processing apparatus includes the microwave oscillator oscillating the "TE11 mode" microwave, the cylindrical waveguide 105 connected to the microwave oscillator, the circularly-polarized wave converter 107 arranged in the middle of the cylindrical waveguide 105 to rotate the "TE11 mode" microwave, the first to the fourth branch waveguides 109, 111, 113, 115 connected to the outer face of the lower end of the cylindrical waveguide 105 at intervals of 90 degrees around the axis of the waveguide 105, the annular antenna 117 to which the first to the fourth branch waveguides are connected apart from each other by 90 degrees in the circumferential direction, and the process container 52 having the sealing plate provided with the annular antenna 117. Therefore, it is possible to form the traveling wave rotating in the circumferential direction, in the annular antenna 117. Thus, it is possible to provide the interior of the processing container 117 with an uniform electromagnetic field, whereby an uniform plasma can be produced. Therefore, it is possible to apply an uniform processing on even a large-diameter wafer.

Figure 11:
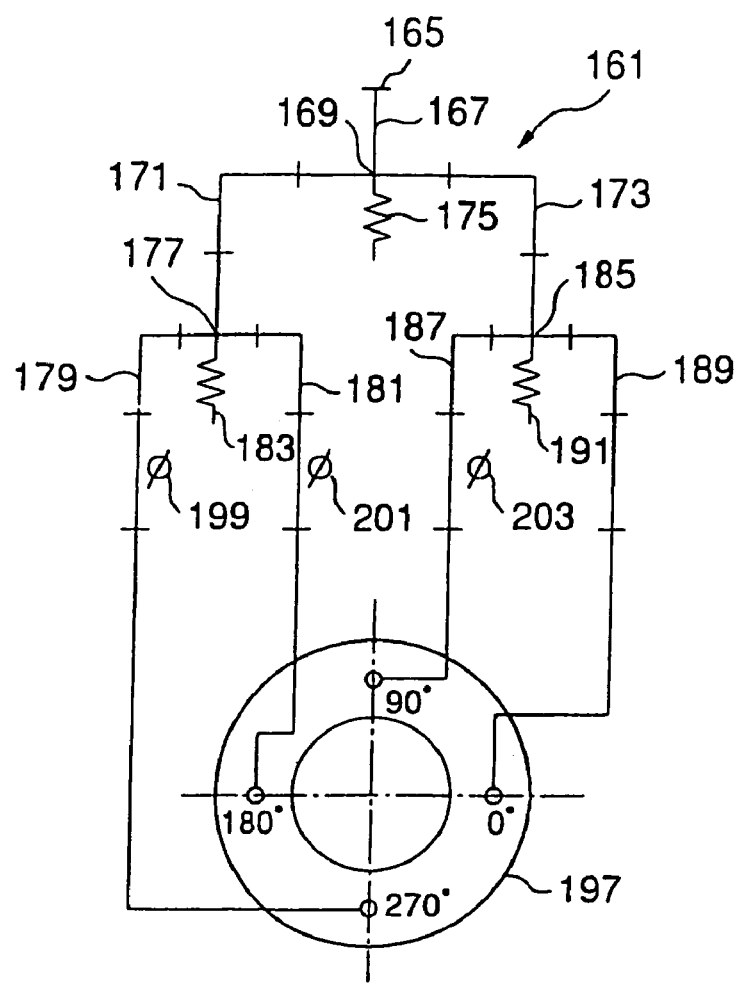
FIG. 11 is a diagram of a circuit of the processing apparatus of FIG. 10.

FIGS. 10 to 14 show the eighth embodiment of the present invention. FIG. 10 is a perspective view of the embodiment, while FIG. 11 is a circuit diagram of the embodiment. In these figures, a plasma processing apparatus 161 has a waveguide 163. This waveguide 163 includes a first rectangular waveguide 167 having a microwave introductory port 165. The first rectangular waveguide 167 is divided into a second rectangular waveguide 171, a third rectangular waveguide 173 and a first dummy load 175 by a first "magic" T member 169. Further, the second rectangular waveguide 171 is divided into a fourth rectangular waveguide 179, a fifth rectangular waveguide 181 and a second dummy load 183 by a second "magic" T member 177. Also, the third rectangular waveguide 173 is divided into a sixth rectangular waveguide 187, a seventh rectangular waveguide 189 and a third dummy load 191 by a third "magic" T member 185.

Figure 12:
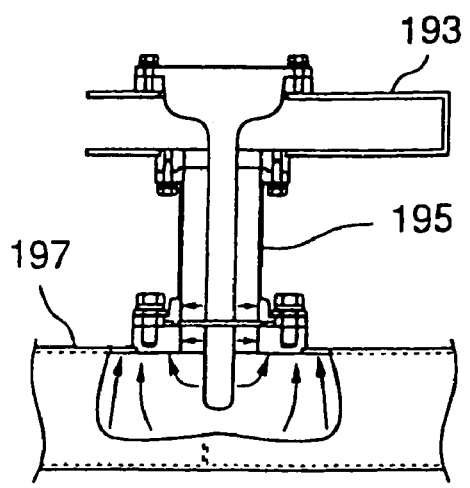
FIG. 12 is a partially-cutaway sectional view showing a connecting part between a branch waveguide and an annular antenna in the processing apparatus of FIG. 10.
Figure 13:
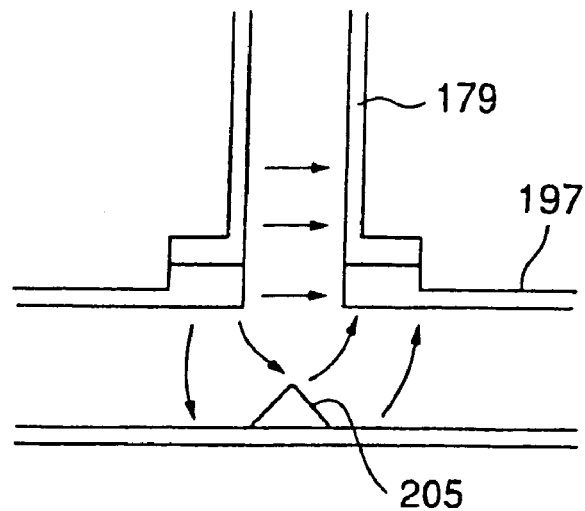
FIG. 13 is a sectional view showing another example of the connecting part between the branch waveguide and the annular antenna of FIG. 12.

Respective lower ends 193 . . . of the fourth rectangular waveguide 179, the fifth rectangular waveguide 181, the sixth rectangular waveguide 187 and the seventh rectangular waveguide 189 are all bent at right angles and connected to an annular antenna 197 through coaxial waveguides 195, as shown in FIG. 12. Connections of these four rectangular waveguides 179, 181, 187, 189 with the annular antenna 197 are separated from each other by 90 degrees in the circumferential direction, as shown in FIGS. 10 and 11.

Additionally, as shown in FIG. 11, phase shifters 199, 201, 203 are interposed in the fourth rectangular waveguide 179, the fifth rectangular waveguide 181 and the sixth rectangular waveguide 187, respectively. These phase shifters 199, 201, 203 operate to shift respective phases of microwaves propagated in the respective waveguides by predetermined amounts thereby to shift the respective microwaves at a point of time reaching the annular antenna 197 successively. Consequently, as a whole, the phase shifters 199, 201, 203 serve to form a traveling wave in the annular antenna.

In the plasma processing apparatus 161 constructed above, the microwave introduced from a "TE10 mode" microwave generator (not shown) into the microwave introductory port is divided at the first "magic" T member and further divided, at the second and the third "magic" T members 177, 185, into four parts finally. In the so-divided microwaves, the microwaves propagated in the fourth rectangular waveguide 179, the fifth rectangular waveguide 181 and the sixth rectangular waveguide 187 are adjusted in respective phases by the phase shifters 199, 201, 203, so that the traveling wave is formed in the annular antenna 197 finally.

In this way, the plasma processing apparatus 161 includes the microwave generator for generating the "TE10 mode" microwave, the waveguide 163 having one end connected to the generator and other ends connected to the annular antenna 163 at respective positions apart from each other in the circumferential direction of the antenna 163, and also the phase shifters 199, 201, 203 which are arranged in the branch waveguides of the above waveguide to adjust the phases of plural microwaves divided by the branch waveguides so that the traveling wave is produced in the annular antenna 197 when the so-divided microwaves are supplied into the annular antenna 197. Therefore, it is possible to emit the uniform plasma into the processing container through the annular antenna 197, whereby the inform plasma can be produced in the processing container.

Note, as shown in FIG. 12, although the fourth rectangular waveguide 179, the fifth rectangular waveguide 181, the sixth rectangular waveguide 187 and the seventh rectangular waveguide 189 are connected to the annular antenna 197 through the coaxial waveguides 195 in the eighth embodiment, the present invention is not limited to this arrangement only. For example, in the modification shown in FIG. 13, the rectangular waveguide 179 etc. is connected to the annular antenna 197 directly, while its connecting part is provided with a bump 205 allowing the microwave to be introduced into the annular antenna 197.

Figure 14:
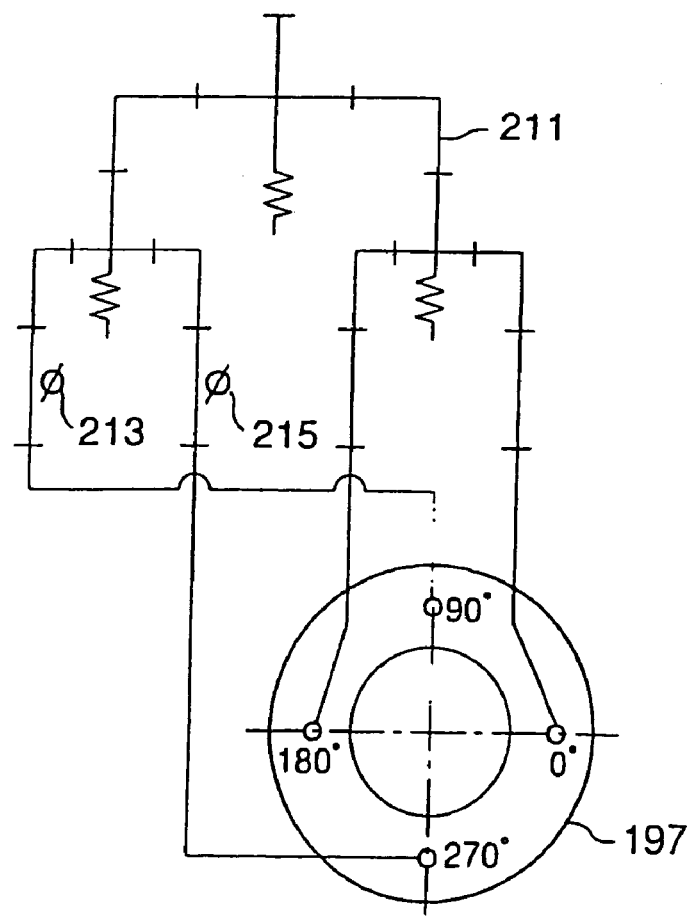
FIG. 14 is a diagram showing another example of the circuit of the processing apparatus of FIG. 11.

Additionally, although three phase shifters 199, 201, 203 are provided in the eighth embodiment, it is not limited to this arrangement. For example, as shown in FIG. 14, if there is adopted an arrangement where four divided waveguides 211 are connected with the annular antenna 197 on consideration of basic characteristics of the "magic" T member, then the purpose of the invention could be attained by only providing two phase shifters 213, 214.

Note, in common with the seventh embodiment of FIG. 9 and the eighth embodiment of FIG. 10, the plural waveguides are connected to the annular waveguide to provide it with multiphase microwaves, thereby producing the traveling wave in the annular waveguide. This arrangement is supported by the following condition.

Figure 15:
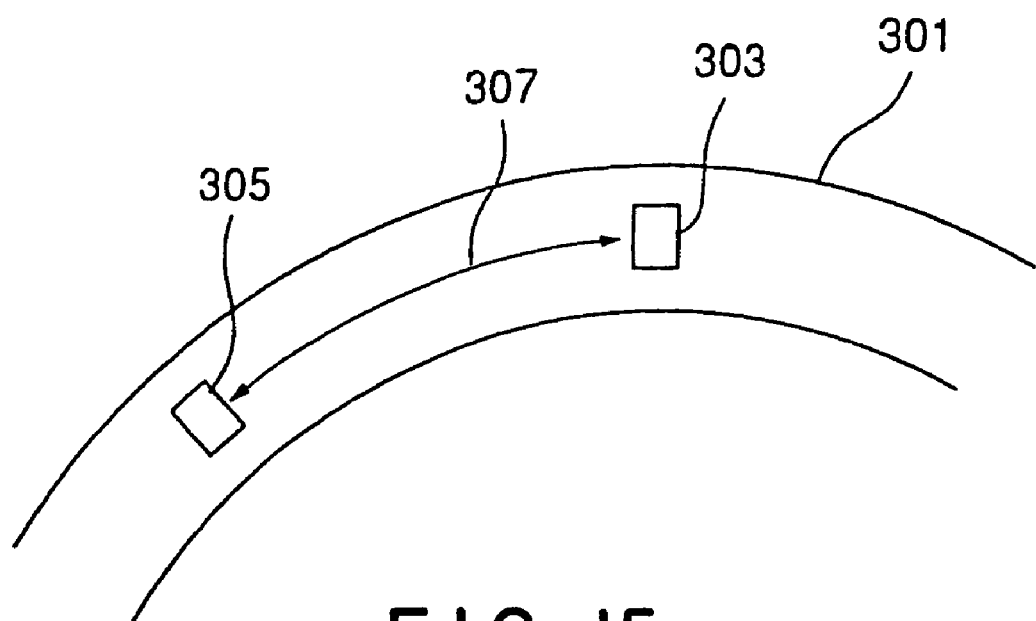
FIG. 15 is a view showing a relationship between the annular waveguide and supply ports for microwave.

Now, we study a case that one microwave supply port A 303 and another microwave supply port B 305 are arranged in an annular waveguide 301, as shown in FIG. 15.

It is assumed that the phase standard resides in the supply port A 303 where the phase is equal to zero. If the phase at the supply port B 305 has a delay of [−θt], then it can be conversely said that the phase at the supply port A 303 precedes the phase at the supply port B 305 by [θt] on the ground of the phase standard at the supply port B 305. It is further assumed that a phase change amounts to [θL] at the supply port A under condition that the microwave is propagated in a waveguide path 307 between the supply port A and the supply port B.

Then, a condition allowing the microwave to be propagated from the supply port A to the supply port B is as follows:

−θt+θL=360°×N (note: N is zero or natural number)

θt+θL=180°×(2M+1) (note: M is zero or natural number)

From the above equations, there are established the following equations:

2θL=360°×N+180°×(2M+1)

θL=180°×N+90×(2M+1)

This condition constitutes an arithmetical progression of 90° in initial value and 180° in difference. It doesn't matter which of the above values is selected as to the interval between the supply ports on the annular waveguide.

Figure 16:
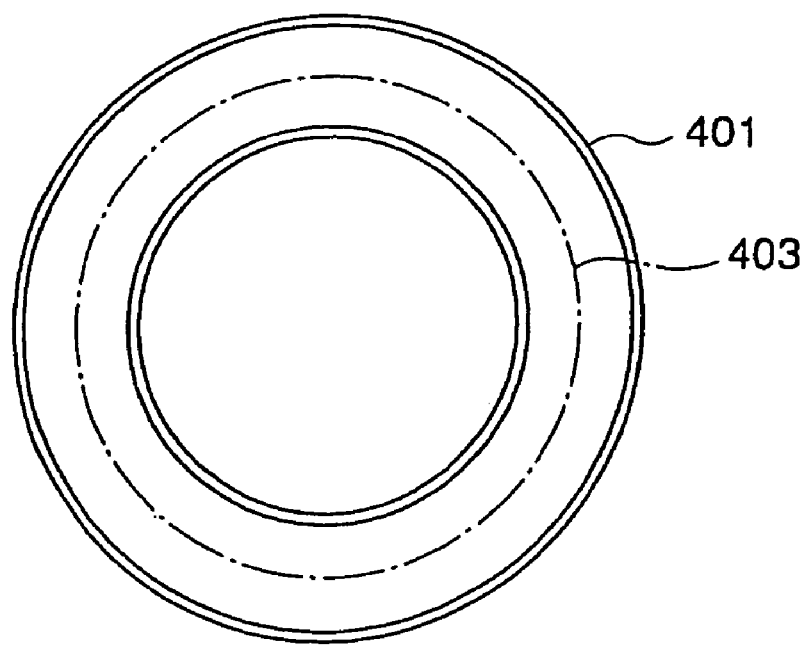
FIG. 16 is a view showing a circumferential length of the annular waveguide.
Figure 17:
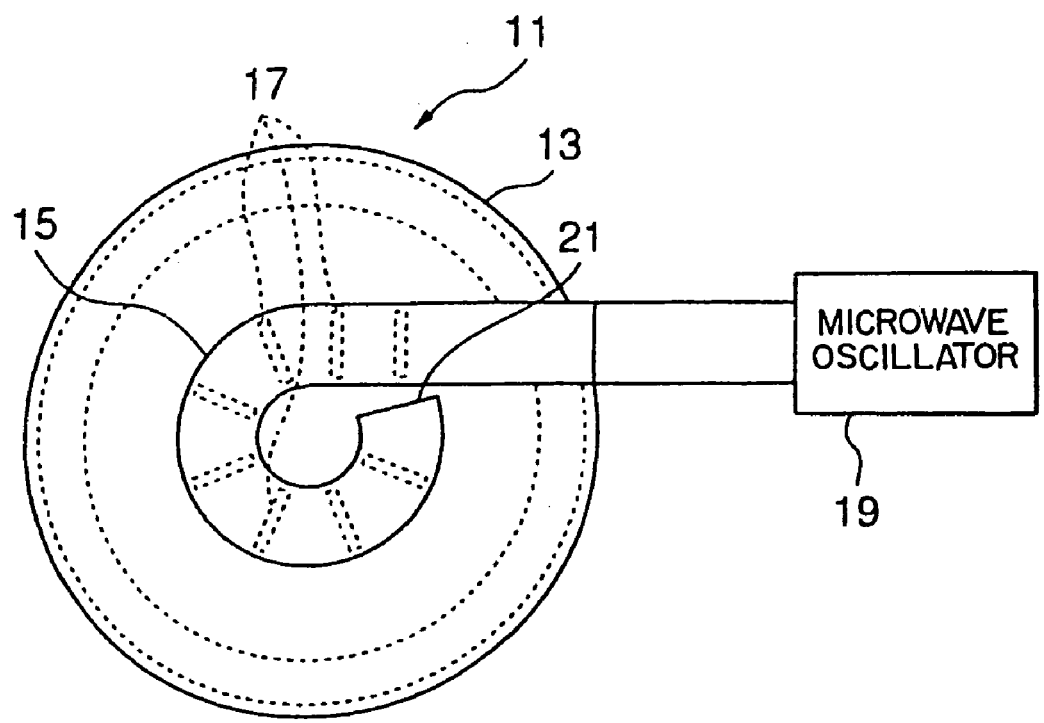
FIG. 17 is a plan view showing a plasma processing apparatus in the related art.
Figure 18:
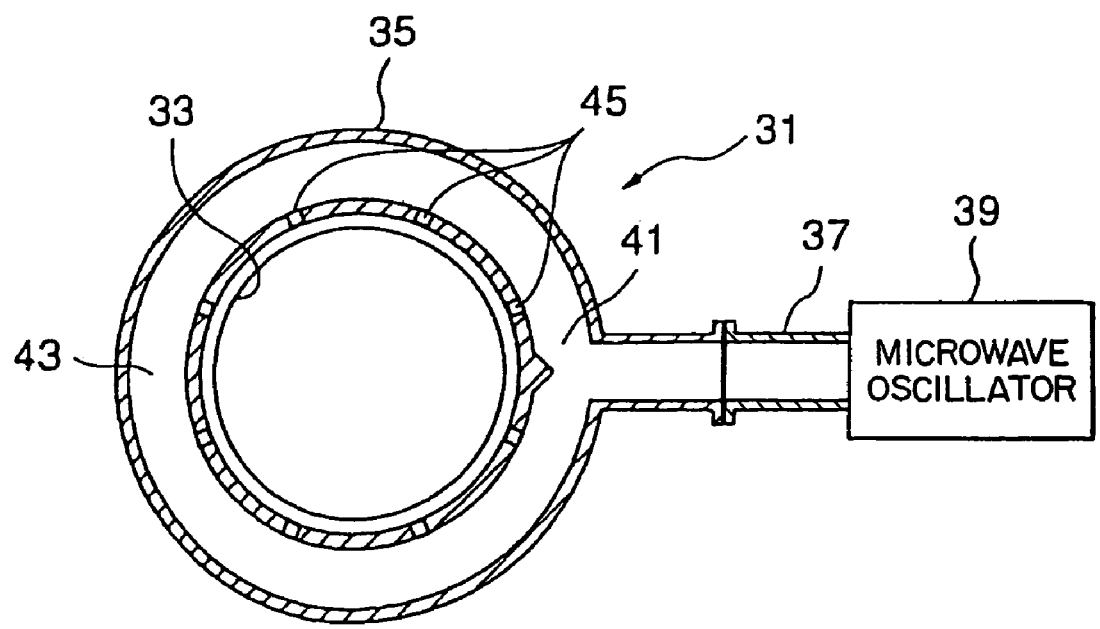
FIG. 18 is a plan sectional view showing another example of the plasma processing apparatus in the related art.
Figure 19:
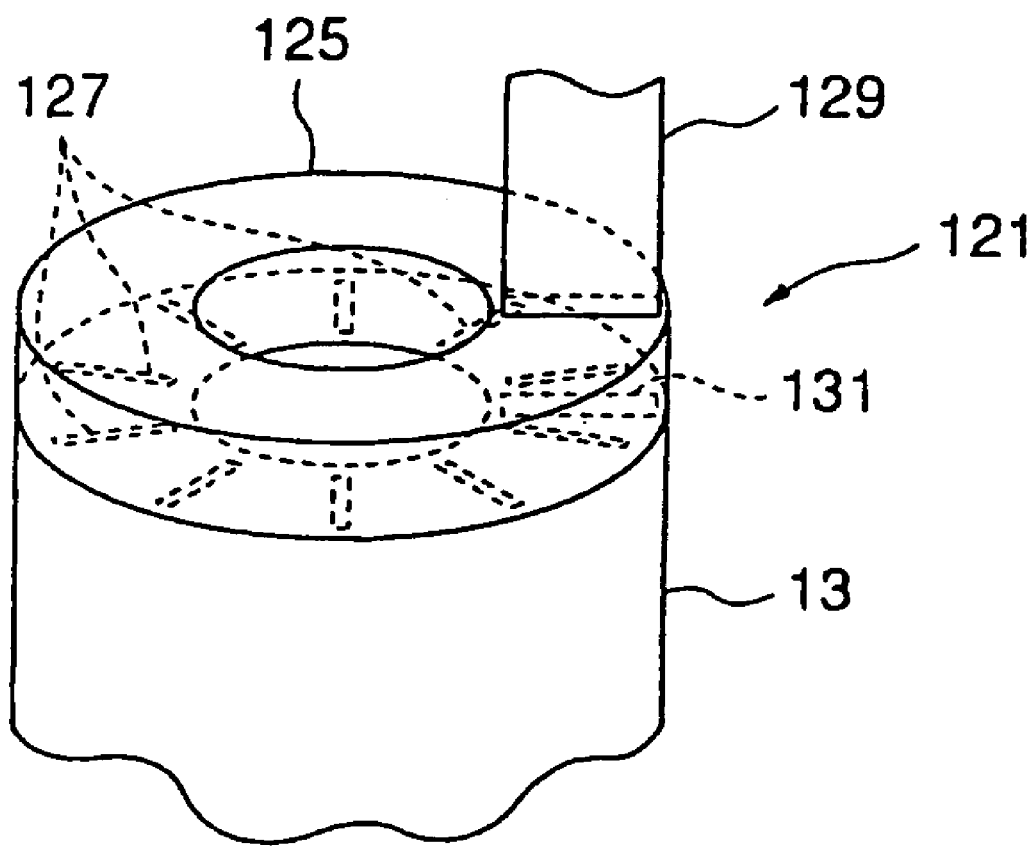
FIG. 19 is a perspective view showing a further example of the plasma processing apparatus in the related art.

Additionally, in order that a phase of microwave supplied from the supply port A agrees with a phase of microwave again returning the supply port A after being propagated in the annular waveguide, its circumferential length has to be a natural number of times as long as a wave length in the annular waveguide. Note, in this specification, the above circumferential length designates a length of a center line 403 of the section of an annular waveguide 401, as shown in FIG. 16.

In order to establish a wave motion in the form of a standing wave in the annular waveguide, there is required a condition where the microwave is propagated in both directions between the supply port A and the supply port B. That is as follows:

−θt+θL=360°×N (note: N is zero or natural number)

θt+θL=180°×(2M+1) (note: M is zero or natural number)

2θL=360°×K (note: K is a natural number)

θL=180°×K

Further, the circumferential length of the annular waveguide has to be a natural number of times as long as a wave length in the waveguide.

The apparatus of the present invention is applicable for etching, ashing, CVD, change in the characters of membrane, etc.

Note, although the antenna in the form of a circular loop is adopted in the above embodiments, without limitation to this configuration, the antenna may be shaped to be rectangular or polygonal. Additionally, without limitation to the semiconductor wafer, a substrate for flat-panel display, such as LCD, may be adopted as an object to be processed.

As mentioned above, according to the present invention, the plasma processing apparatus comprises the processing container in form of a cylinder with a bottom, the supporting unit disposed in the processing container to support an object to be processed, the dielectric window arranged in an opening of the processing container to close up the processing container in an air-tight manner, the dielectric window having a dielectric body allowing a high-frequency wave to permeate an interior of the processing container, the annular waveguide shaped in form of a ring to introduce the high-frequency wave into the processing container through the dielectric window and also fitted to the dielectric window so that a plane containing an annular waveguide path of the annular waveguide extends along the dielectric window, and the traveling-wave generator arranged in the annular waveguide to produce a traveling wave in form of an endless ring in the annular waveguide. Accordingly, it is possible to form a traveling wave rotating in the annular waveguide, whereby an uniform electromagnetic field can be emitted into the processing container. Thus, it is possible to produce an uniform plasma in the processing container, allowing of the application of uniform processing on the object to be processed.

What is claimed is:

1. A plasma processing apparatus, comprising:
   a processing container in form of a cylinder with a bottom;
   a supporting unit disposed in the processing container to support an object to be processed;
   a high-frequency wave generator for supplying a high-frequency wave;
   a propagation waveguide having a first end and a second end, the first end being connected to the high-frequency wave generator;
   a circularly-polarized wave converter arranged between the first end and the second end of the propagation waveguide to rotate the high-frequency wave propagated in the propagation waveguide about an axis of the propagation waveguide;
   a plurality of branched waveguides connected to the second end of the propagation waveguide; and
   an annular waveguide to which the branched waveguides are connected at different angular positions about the axis of the propagation waveguide, the annular waveguide having a plurality of slots, through each of which a high-frequency traveling wave traveling circumferentially in the annular waveguide is supplied to the processing chamber.

2. The plasma processing apparatus according to claim 1, wherein the propagation waveguide has a cylindrical shape, and the branched waveguides are connected to a circumference of the propagation waveguide.

3. The plasma processing apparatus according to claim 2, wherein the branched waveguides are connected to the propagation waveguide at equal angular intervals, and are connected to the annular waveguide at equal angular intervals.

4. The plasma processing apparatus according to claim 3, wherein the branched waveguides number four.

5. The plasma processing apparatus according to claim 1, wherein the high-frequency wave generator is configured to generate a high-frequency wave in TE11 mode.

* * * * *

UNITED STATES PATENT AND TRADEMARK OFFICE
CERTIFICATE OF CORRECTION

| | | |
|---|---|---|
| PATENT NO. | : 7,071,442 B2 | Page 1 of 1 |
| APPLICATION NO. | : 11/009086 | |
| DATED | : July 4, 2006 | |
| INVENTOR(S) | : Nobuo Ishii et al. | |

It is certified that error appears in the above-identified patent and that said Letters Patent is hereby corrected as shown below:

On the title page, item (57), delete lines 15-17 in their entirety.

Signed and Sealed this

Sixth Day of February, 2007

JON W. DUDAS
*Director of the United States Patent and Trademark Office*